(12) United States Patent
Hirose et al.

(10) Patent No.: US 7,114,061 B2
(45) Date of Patent: Sep. 26, 2006

(54) INFORMATION PROCESSING APPARATUS WITH CONFIGURABLE PROCESSOR

(75) Inventors: Yoshio Hirose, Kawasaki (JP); Miyoshi Saito, Kawasaki (JP); Wouter Couzijn, Heiloo (NL)

(73) Assignee: Fujitsu Limited, Kawasaki (JP)

( * ) Notice: Subject to any disclaimer, the term of this patent is extended or adjusted under 35 U.S.C. 154(b) by 456 days.

(21) Appl. No.: 10/627,709

(22) Filed: Jul. 28, 2003

(65) Prior Publication Data

US 2004/0025121 A1 Feb. 5, 2004

(30) Foreign Application Priority Data

Jul. 31, 2002 (JP) ............................. 2002-224074

(51) Int. Cl.
*G06F 9/30* (2006.01)
(52) U.S. Cl. ..................................... 712/226
(58) Field of Classification Search ................ 712/226, 712/15, 34, 35
See application file for complete search history.

(56) References Cited

U.S. PATENT DOCUMENTS 5,848,289 A * 12/1998 Studor et al. .................. 712/32
6,128,720 A * 10/2000 Pechanek et al. ............. 712/20
6,826,674 B1 * 11/2004 Sato ........................... 712/200
6,959,378 B1 * 10/2005 Nickolls et al. ............. 712/229

* cited by examiner

*Primary Examiner*—Eric Coleman
(74) *Attorney, Agent, or Firm*—Staas & Halsey LLP

(57) ABSTRACT

In a processor, an operating unit executes an instruction within an instruction set, and a second operating unit executes other custom instructions. The second operating unit consists of a plurality of AND circuits, OR circuits, adders, selectors, and multiplexers. The information about which circuit should be combined with which circuit when the instruction is input is held in advance as structure information in a configuration memory. One piece of structure information corresponds to one custom instruction. The second operating unit in an optimum circuit structure determined based on this structure information executes the instruction. With this arrangement, it is possible to increase the processing speed than when the operating unit executes the processing.

28 Claims, 20 Drawing Sheets

| STRUCTURE INFORMATION OF FIRST CUSTOM INSTRUCTION |
| --- |
| STRUCTURE INFORMATION OF SECOND CUSTOM INSTRUCTION |
| STRUCTURE INFORMATION OF THIRD CUSTOM INSTRUCTION |
| ⋮ |
| STRUCTURE INFORMATION OF n-TH CUSTOM INSTRUCTION |

| OPERATION CODE THAT SHOWS CUSTOM INSTRUCTION | MEMORY ADDRESS | rs1 | rs2 | rd |
| --- | --- | --- | --- | --- | rs1:SOURCE REGISTER 1
rs2:SOURCE REGISTER 2
rd:DESTINATION REGISTER

FIG.11

| | | 8 BITS | 32 BITS |
|---|---|---|---|
| FIRST TIME | SHIFT QUANTITY | 1 | 1 |
| | MASK PATTERN | 01010101(0x55) | 01010101 01010101 01010101 01010101 (0x55555555) |
| SECOND TIME | SHIFT QUANTITY | 2 | 2 |
| | MASK PATTERN | 00110011(0x33) | 00110011 00110011 00110011 00110011 (0x33333333) |
| THIRD TIME | SHIFT QUANTITY | 4 | 4 |
| | MASK PATTERN | 00001111(0x0F) | 00001111 00001111 00001111 00001111 (0x0F0F0F0F) |
| FOURTH TIME | SHIFT QUANTITY | | 8 |
| | MASK PATTERN | | 00000000 11111111 00000000 11111111 (0x00FF00FF) |
| FIFTH TIME | SHIFT QUANTITY | | 16 |
| | MASK PATTERN | | 00000000 00000000 11111111 11111111 (0x0000FFFF) |

FIG.15

| 1  | 2  | 3  | 4  | 5  | 6  | 7  | 8  |
|----|----|----|----|----|----|----|----|
| 9  | 10 | 11 | 12 | 13 | 14 | 15 | 16 |
| 17 | 18 | 19 | 20 | 21 | 22 | 23 | 24 |
| 25 | 26 | 27 | 28 | 29 | 30 | 31 | 32 |
| 33 | 34 | 35 | 36 | 37 | 38 | 39 | 40 |
| 41 | 42 | 43 | 44 | 45 | 46 | 47 | 48 |
| 49 | 50 | 51 | 52 | 53 | 54 | 55 | 56 |
| 57 | 58 | 59 | 60 | 61 | 62 | 63 | 64 |

FIG.16

| 58 | 50 | 42 | 34 | 26 | 18 | 10 | 2 |
|----|----|----|----|----|----|----|---|
| 60 | 52 | 44 | 36 | 28 | 20 | 12 | 4 |
| 62 | 54 | 46 | 38 | 30 | 22 | 14 | 6 |
| 64 | 56 | 48 | 40 | 32 | 24 | 16 | 8 |
| 57 | 49 | 41 | 33 | 25 | 17 | 9  | 1 |
| 59 | 51 | 43 | 35 | 27 | 19 | 11 | 3 |
| 61 | 53 | 45 | 37 | 29 | 21 | 13 | 5 |
| 63 | 55 | 47 | 39 | 31 | 23 | 15 | 7 |

FIG.17A

BEFORE REPLACING BITS

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |

FIG.17B

AFTER REPLACING BITS

| 26 | 18 | 10 | 2 | * | * | * | * | 28 | 20 | 12 | 4 | * | * | * | * | 30 | 22 | 14 | 6 | * | * | * | * | 32 | 24 | 16 | 8 | * | * | * | * |

INFORMATION PROCESSING APPARATUS WITH CONFIGURABLE PROCESSOR

CROSS-REFERENCE TO RELATED APPLICATIONS

This application is based upon and claims the benefit of priority from the prior Japanese Patent Application No. 2002-224074, filed on Jul. 31, 2002, the entire contents of which are incorporated herein by reference.

BACKGROUND OF THE INVENTION

1) Field of the Invention

The present invention relates to an apparatus for information processing having a processor and a method of information processing.

2) Description of the Related Art

As the technology of semiconductor fine pattern processing advances, since each component in a circuit becomes smaller, the circuits mounted on Large Scale Integrated (LSI) chips became larger in scale. Moreover, development of a system (that is, a system LSI) in which a processor (that is, a central processing unit (CPU)) and custom made circuits are mounted on a chip has been conventionally carried out.

There are two types of methods for developing a system LSI suitable for a user's application: (1) a method of mounting circuit blocks according to the application independent of the processor, and (2) a method of correcting the processor itself according to the application.

The above (1) is a developing method to realize general system LSIs on a chip. The above (2) is a method of developing a configurable processor and is employed in Tensilca Inc. and ARC International. According to this method (2), an exclusive instruction suitable for a user's application (that is, a custom instruction) is added to the instruction set, and at the same time, a functional unit that executes the instruction is added to the processor.

However, as the processes become finer, the processing cost including the cost of masks increases considerably. Only some of the system LSIs, that is, the system LSIs that are produced in a very large quantity, are profitable, while most of the others are not. In other words, the above methods (1) and (2) are suitable for a mass production of the system LSIs and do not suit for manufacturing of the system LSIs in a small quantity.

On the other hand, in recent years, a mixed mounting of a processor and a Field Programmable Gate Array (FPGA) on a chip has been employed as a method (3), and products are actually available based on this method. According to this method, it is possible to realize various kinds of circuits corresponding to the user's applications, by using FPGA blocks. However, the area efficiency of the FPGA is as low as one-tenth to one-twentieth of that of the normal circuit, and therefore, the FPGA blocks are expensive. Further, it is not possible to obtain high operating frequency in the FPGA portion, and in order to obtain high performance, it is necessary to set these portions in a parallel layout. This results in the increase in the circuit scale.

SUMMARY OF THE INVENTION

It is an object of the present invention to solve at least the problems in the prior art.

The information processing apparatus according to one aspect of the present invention comprises a deciding unit that decides whether a given instruction exists within a predetermined instruction set; a first operating unit that executes the instruction when the deciding unit decides that the instruction exists within the predetermined instruction set; a structure information output unit that outputs structure information for determining a circuit structure to execute the instruction when the deciding unit decides that the instruction does not exist within the predetermined instruction set; and at least one second operating unit that executes the instruction in the circuit structure determined based on the structure information output from the structure information output unit.

The information processing method according to another aspect of the present invention comprises deciding whether a given instruction exists within a predetermined instruction set; a first step of executing the instruction when it is decided at the deciding that the instruction exists within the predetermined instruction set; outputting structure information for determining a circuit structure to execute the instruction when it is decided at the deciding that the instruction does not exist within the predetermined instruction set; and a second step of executing the instruction in the circuit structure determined based on the structure information output at the outputting.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 11 is an explanatory diagram that shows bit shift quantities and mask patterns in the second operating unit according to the second embodiment of the present invention;

FIG. 15 is an explanatory diagram that shows one example of data before initial permutation;

FIG. 16 is an explanatory diagram that shows one example of data after Initial Permutation;

FIG. 17 is an explanatory diagram that shows a bit replacement rule used by a bit replacing unit contained within the second operating unit according to the third embodiment of the present invention;

DETAILED DESCRIPTION

Exemplary embodiments of the information processing apparatus according to the present invention will be explained in detail below with reference to the accompanying drawings.

Figure 1:
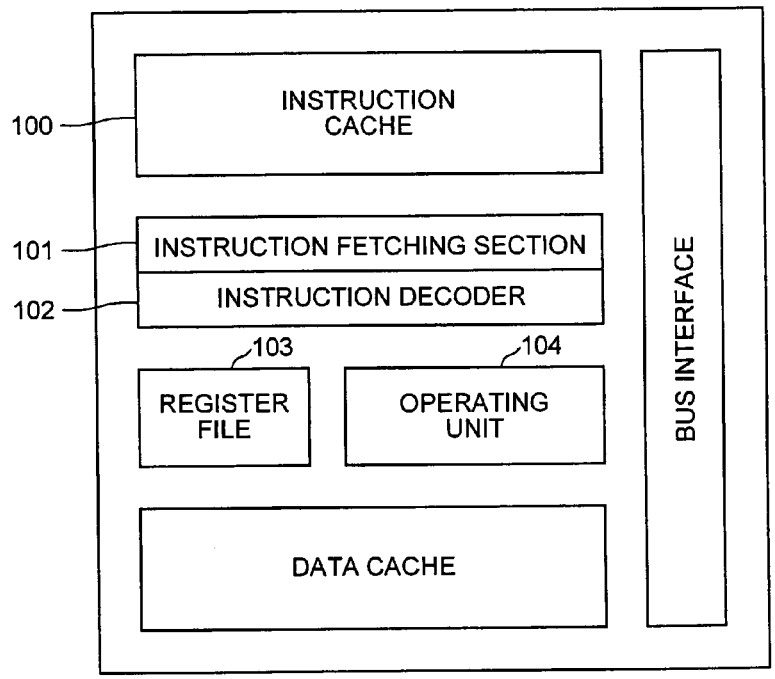
FIG. 1 is a block diagram that schematically shows an internal structure of a processor according to a conventional technique.

Before explaining the embodiments, a basic structure of the information processing apparatus according to the present invention will be explained. FIG. 1 is a block diagram that schematically shows an internal structure of the processor according to a conventional technique. An instruction cache 100 accumulates instructions, and an instruction fetching section 101 reads the accumulated instructions. An instruction decoder 102 interprets the read instructions, and transmits signals to a register file 103 and an operating unit 104 according to the interpretation.

The operating unit 104 can execute only those instructions that exist within an instruction set defined in advance when the processor is designed. Therefore, in order for the operating unit 104 to carry out a complex processing (for example, replacement of bits in data) that does not exist in the predefined instruction set of a general processor, it is necessary to prepare several combinations of instructions that exist within the instruction set. However, as the number of combinations of the instructions becomes larger, the total processing time increases.

In other words, when a processing not known in advance is defined as a custom instruction and when it is possible to build into the processor an operating unit that executes this instruction, it is possible to increase the processing speed.

Figure 2:
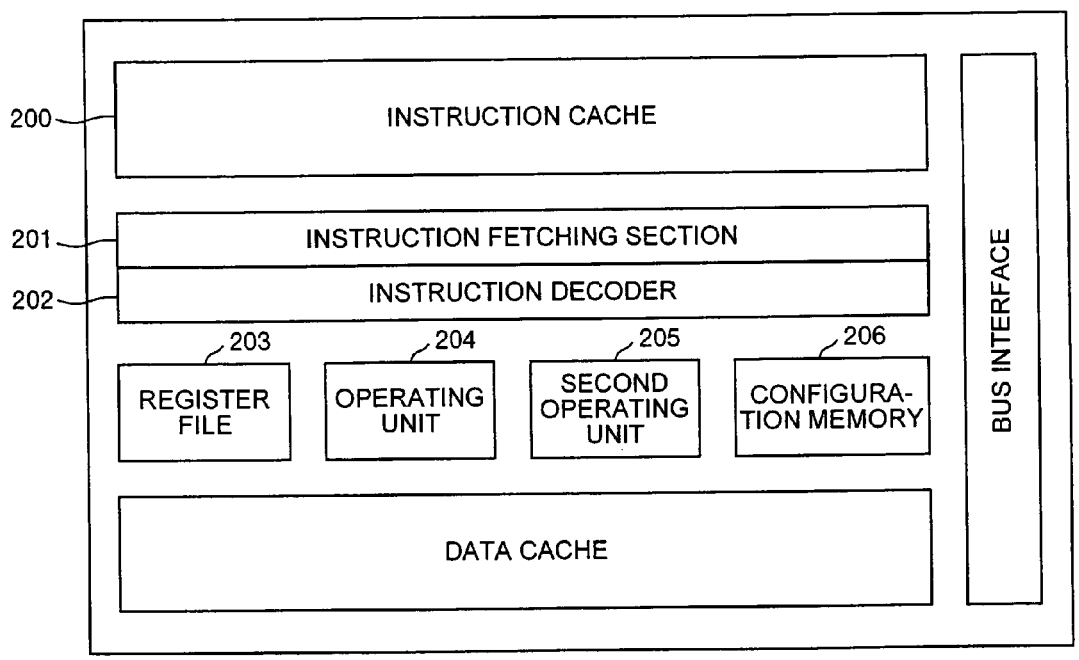
FIG. 2 is an explanatory diagram that schematically shows an internal structure of a processor according to the present invention.

FIG. 2 is an explanatory diagram that schematically shows an internal structure of the processor according to the present invention. As shown in FIG. 2, in addition to the structure of the conventional processor shown in FIG. 1, the processor according to the present invention has a second operating unit 205 that can change the internal structure of the processor based on structure information input to it from outside, and a configuration memory 206 that accumulates and supplies the structure information.

The second operating unit 205 consists of a plurality of AND circuits, OR circuits, adders, selectors, and multiplexers. The processor may have a plurality of second operating units 205, although only one operating unit is shown in FIG. 2. In such a case, there may be a corresponding configuration memory 206 for each operating unit, or a plurality of operating units may share one configuration memory 206. In other words, it is possible to save the cost of the memory by providing reading ports corresponding to the number of the second operating units 205.

Figures 3, 4:
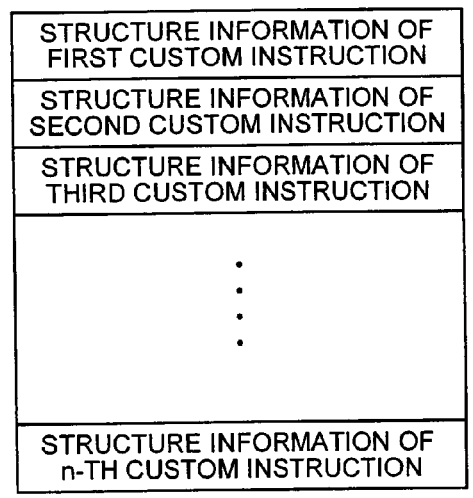
FIG. 3 is an explanatory diagram that schematically shows the contents of a configuration memory according to the present invention.
FIG. 4 is an explanatory diagram that schematically shows one example of a format of an instruction code given to the processor, according to the present invention.

FIG. 3 is an explanatory diagram that schematically shows the contents of the configuration memory 206. As shown in FIG. 3, the configuration memory 206 stores pieces of structure information to be supplied to the second operating unit 205.

The structure information defines a parameter that shows which multiplexer within the second operating unit 205 should select which bit when a certain specific custom instruction is input. The structure information stored in one entry corresponds to one custom instruction. The address from where each entry is read has to be changed for reading each custom instruction. In other words, by changing the supplied structure information, the second operating unit 205 can execute the processing corresponding to each custom instruction.

The process for changing structural information, which is to be output, is explained next. As explained below, assign information to the address stored in configuration memory 206 in order to change the structure information to be supplied to the second operating unit 205.

(1) Assignment Based on Instruction Code

As shown in FIG. 4, a few bits within an instruction code are allocated as an area for assigning addresses of the configuration memory 206. Based on this allocation, it is possible to decide which structure information within this memory is to be output to the second operating unit 205, that is, which custom instruction the second operating unit 205 is to execute.

It is also possible to allocate a different operation code to each custom instruction. However, based on this allocation, the number of custom instructions that can be defined is limited to an upper limit number of the kinds of operation codes. Therefore, a common (i.e., only one) operation code is used to represent all custom instructions, and memory addresses that follow this operation code distinguish between the individual custom instructions.

(2) Assignment Based on Special-Purpose Register

When memory addresses are assigned within the instruction code as explained above, only about five bits at most can be used to assign addresses when a standard 32-bit instruction is used. Therefore, the number of entries that can be assigned is limited to about 32.

As another method, a special-purpose register (SPR) that holds the addresses of the configuration memory 206 may be prepared, and the addresses of structure information corresponding to the custom instructions may be set to this register prior to the execution of these instructions. As the special-purpose register usually has 32 bits, it is possible to assign more addresses than the addresses that can be assigned using the few bits in the instruction code. In other words, it is possible to mount a larger-scale configuration memory 206.

When the special-purpose register is utilized, custom instructions are executed in two steps; a first step of setting the addresses of the configuration memory 206 to the register; and a second step of supplying the structure information at these addresses to the second operating unit 205, and actually executing the instructions. However, when the same custom instruction is executed continuously, it is not necessary to set the address to the special-purpose register at each time of the execution. Therefore, the overhead of this address setting does not occur.

(3) Assignment Based on Instruction Code and Special-Purpose Register

When the above assigning methods (1) and (2) are combined together, thereby to assign a part of the memory addresses (for example, high-order addresses) in the special-purpose register and assign the rest of the memory addresses (for example, low-order addresses) in the instruction code, it becomes possible to effectively execute the custom instructions based on the mounting of a large-scale memory while mutually compensating for drawbacks of respective methods.

The processing for changing the structure information, which is in the memory, is explained next. When a read-only memory such as a ROM is used for the configuration memory 206, the number of kinds of custom instructions that the second operating unit 205 can execute is limited to the number of the entries of the memory.

On the other hand, when a random access memory (RAM) is used for the configuration memory 206, the second operating unit 205 can execute custom instructions of at least the number of the entries, or theoretically an unlimited number of custom instructions, by rewriting the information into the memory during the execution of the program. The structure information can be loaded into the configuration memory 206 as follows.

(1) First Loading Method: Adding to the Instruction Set, a Load Instruction to Load the Structure Information into the Configuration Memory 206.

A load instruction to load the structure information onto the configuration memory 206 is added to the instruction set, and the operating unit 204 is expanded so as to be able to execute the instruction. When the load instruction is supplied from the instruction decoder 202, the operating unit 204 loads the structure information at the address assigned by the instruction into the assigned location in the configuration memory 206.

(2) Second Loading Method: Substituting a Load Instruction to Load the Structure Information into the Configuration Memory 206 with a Plurality of Load Instructions.

As an alternative method, when the instruction fetching section 201 detects a load instruction to load the structure information into the configuration memory, the instruction fetching section 201 supplies a necessary number of load instructions to the instruction decoder 202 in place of this instruction to load into the configuration memory, and stores the loaded data into the configuration memory 206. For example, when the structure information to be loaded has 256 bits, the instruction fetching section 201 supplies eight load instructions or four double word load instructions to the instruction decoder 202 in place of the instruction to load into the configuration memory.

(3) Third Loading Method: Mapping the Configuration Memory 206 to the Special-Purpose Register.

An instruction to transfer data to the special-purpose register, which is already included in the instruction set, may be utilized as another method. The configuration memory 206 is mapped to the special-purpose register, and an instruction to load data into a general-purpose register and the instruction to transfer the data from the general-purpose register to the special-purpose register are executed. With this arrangement, the structure information is loaded into the configuration memory 206. It is possible to realize the loading of the structure information into the configuration memory 206 by combining these instructions in the program. Therefore, it is not particularly necessary to prepare exclusively, the instruction to load the data into the configuration memory, in the instruction set. However, in order to reduce the load of a programmer, this instruction may be added to the instruction set, and the instruction decoder 202 may substitute this instruction with the instruction to load the data onto the general-purpose register and the instruction to transfer the data from the general-purpose register to the special-purpose register.

(4) Fourth Loading Method: Mapping the Configuration Memory 206 to the Normal Address Space.

The configuration memory 206 is mapped to the normal address space, and the instruction to load the data into the register and the instruction to store the data in the area to which the memory is allocated, are executed. Alternatively, a (Direct Memory Access) DMA controller is started, and the data is directly transferred from an external memory to the configuration memory 206. Based on these methods, it is possible to load the structure information onto the configuration memory 206. It is possible to realize the loading of the structure information into the configuration memory 206, either by combining the load instruction and the store instruction in the program or by starting the DMA controller. Therefore, it is not particularly necessary to prepare the instruction to load the data into the configuration memory, in the instruction set. However, in order to reduce the load of the programmer, this instruction may be added to the instruction set, and the instruction decoder 202 may substitute this instruction with the load instruction and the store instruction or with the instruction to start the DMA controller.

Figure 5:
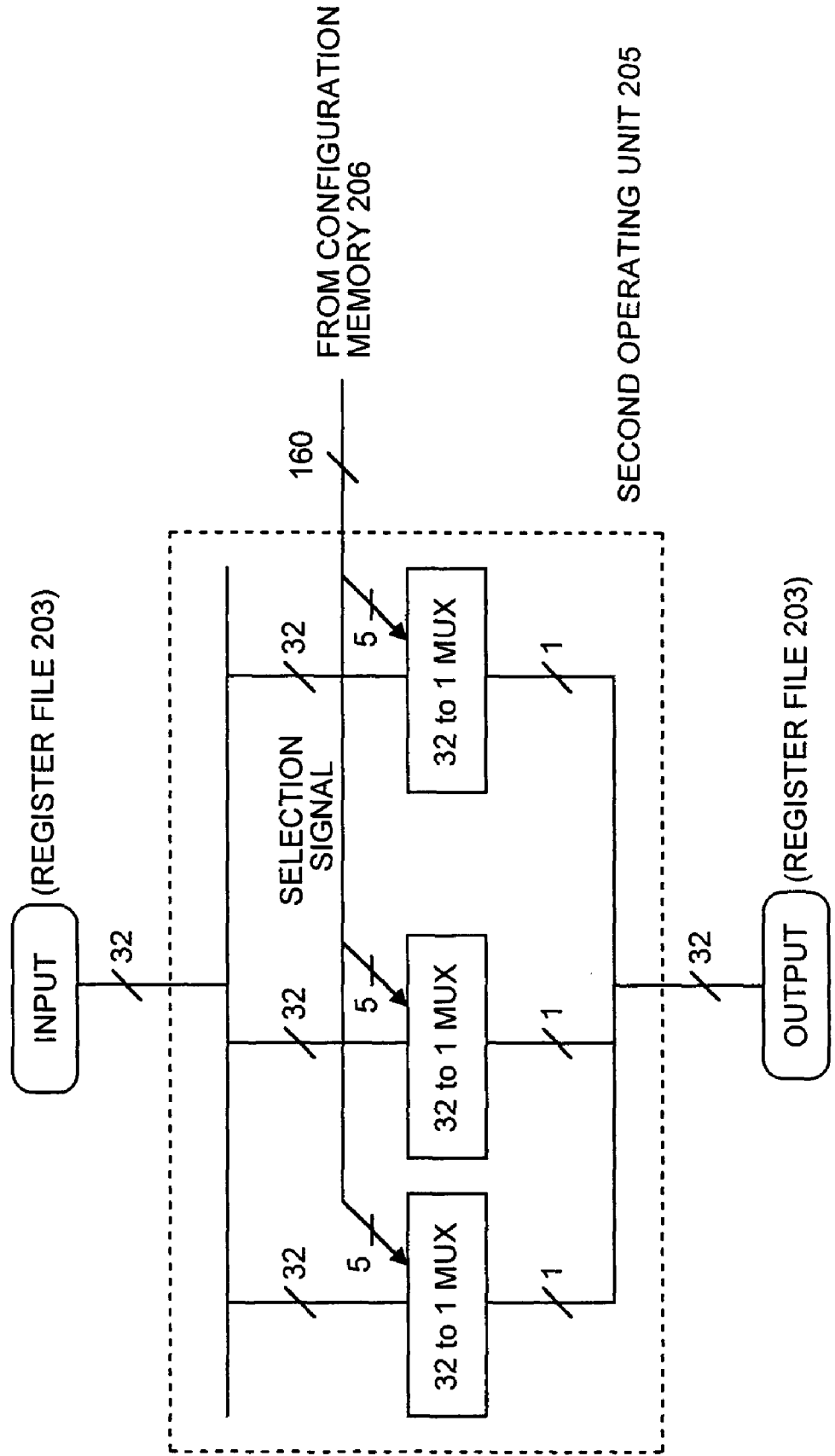
FIG. 5 is an explanatory diagram that schematically shows an internal structure of a second operating unit according to a first embodiment of the present invention.

A bit interchanging processing according to a first embodiment of the present invention will be explained next. FIG. 5 is an explanatory diagram that schematically shows the internal structure of the second operating unit 205 according to the first embodiment of the present invention. A selection signal is applied to each of 32 multiplexers within the second operating unit 205 (while only three multiplexers are shown in the drawing, there are actually 32 multiplexers) so that these multiplexers output bits of mutually different positions. With this arrangement, it becomes possible to place a bit at one position in the input data (it is assumed that there are 32 bits) from a register file 203 to another position in the output data. In other words, it becomes possible to shuffle the bits of all patterns.

In this case, at least five bits are necessary to assign one bit out of the 32 bits. Therefore, the selection signals supplied from the configuration memory 206 to the second operating unit 205, that is, all pieces of structure information, have at least 160 bits (5 bits×32).

A bit string that includes at least one of 1 and 0, that is, a bit string other than all 0s ("000 . . . 000") and all 1s ("111 . . . 111") is applied as the input data from the register file 203. Based on a suitable preparation of the selection signals, it becomes possible to generate the output data of all the bit patterns. In other words, it becomes possible to realize a pattern generator that outputs an optional mask pattern.

A user may either explicitly set the input data to a general-purpose register based on a program, or it is also possible to allocate any one general-purpose register as an exclusive register for the data. For example, a fixed value 0 is always set to a general-purpose register number 0 (GR0) of a general processor and a fixed value 1 (i.e., the data having 1 in only the LSB) is set to a general-purpose register number 1 (GR1) of the processor. Therefore if these registers are used, it is not particularly necessary to set values.

Figure 6:
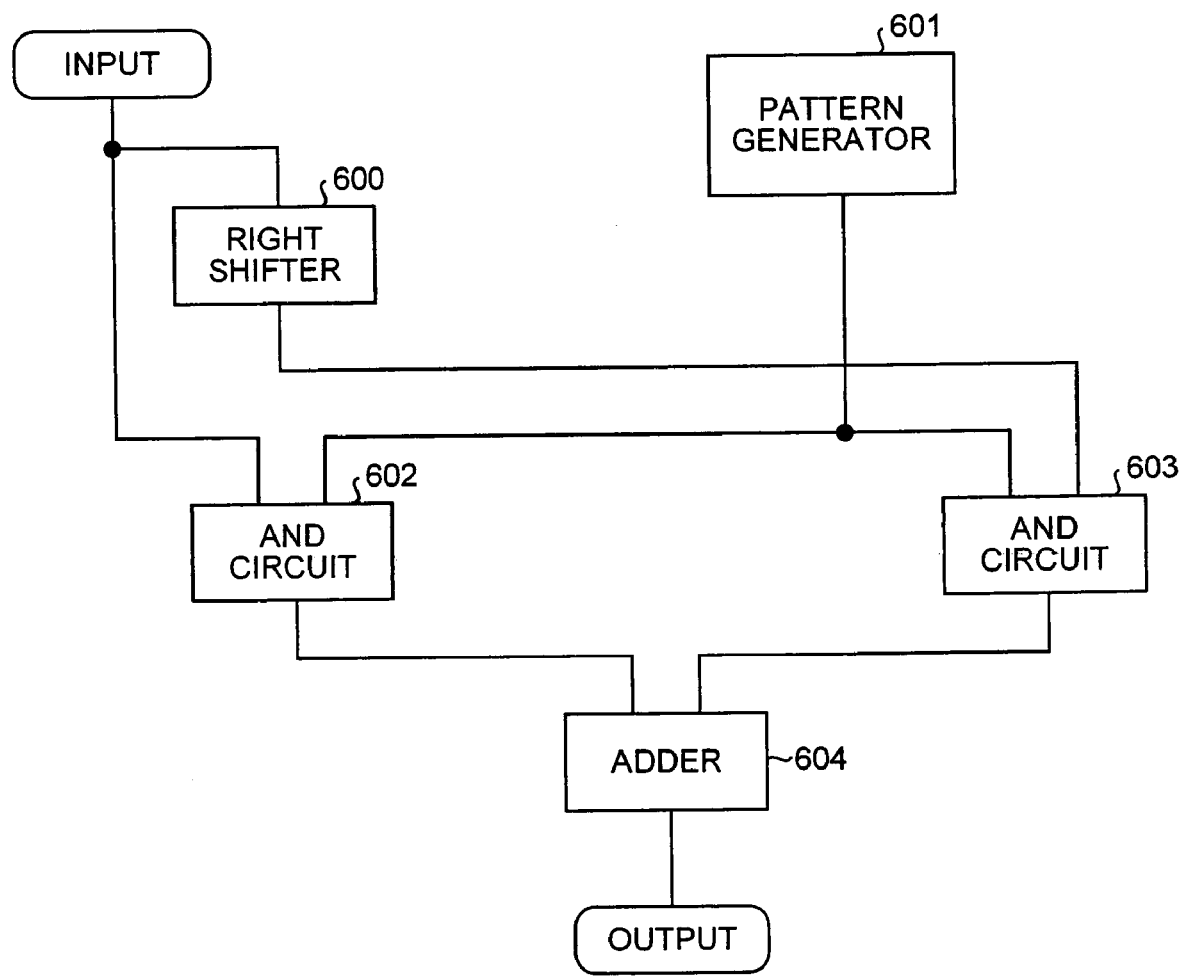
FIG. 6 is an explanatory diagram that schematically shows an internal structure of the second operating unit according to a second embodiment of the present invention.
Figure 7:
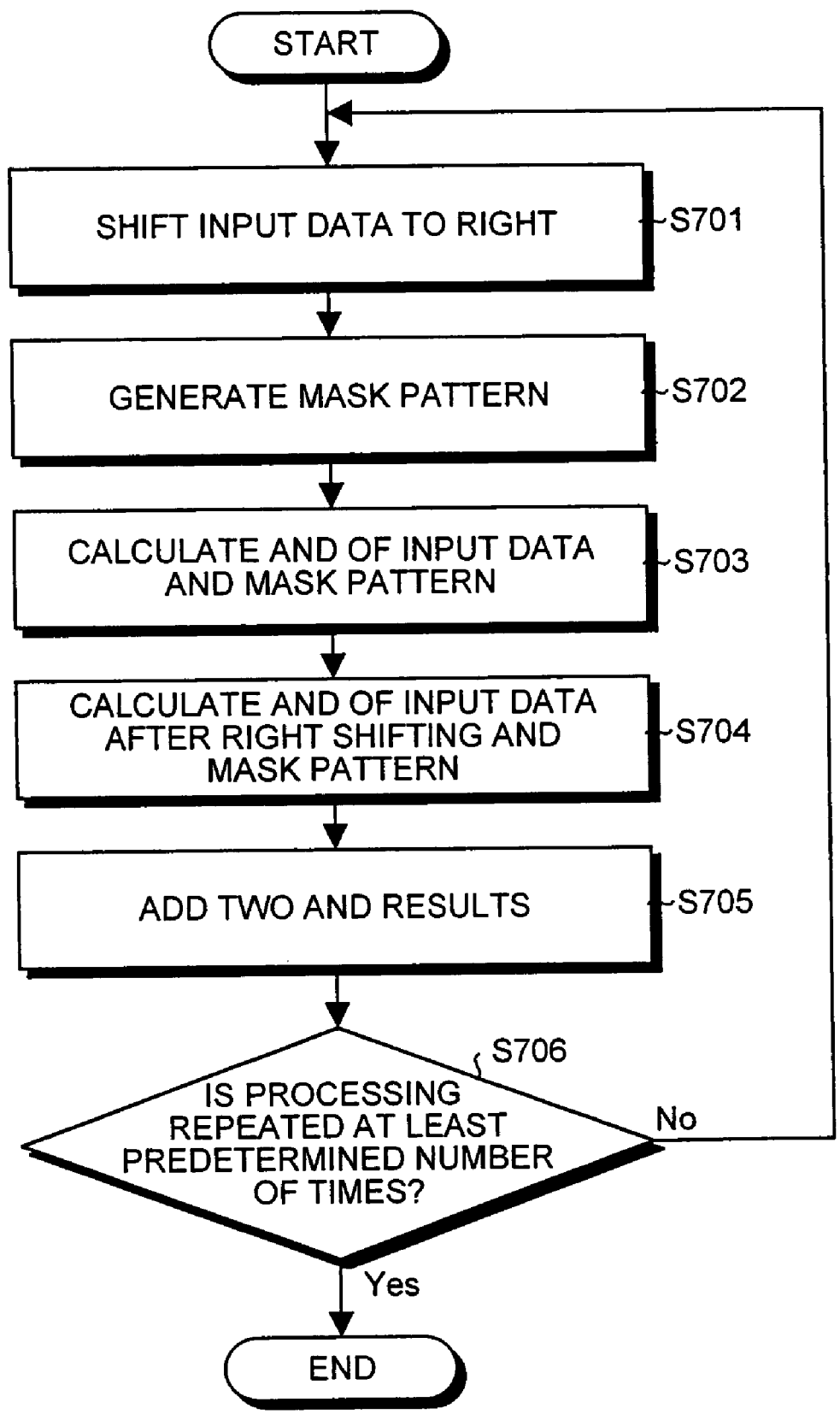
FIG. 7 is a flowchart that shows how the number of 1s in the input data is counted by the second operating unit, according to the second embodiment of the present invention.

The process of counting the number of 1s will be explained according to a second embodiment. FIG. 6 is an explanatory diagram that schematically shows the internal structure of the second operating unit 205 according to the second embodiment of the present invention. A right shifter 600, a pattern generator 601, AND circuits 602 and 603, and an adder (or an ALU) 604 within the second operating unit 205 are used to repeatedly execute the processing shown in FIG. 7 a predetermined number of times. Based on this operation, the number of 1s in the input data is counted.

For the sake of convenience of explanation, eight-bit data such as "abcdefgh" is considered as the input data. Each bit of "a" or "b" expresses 0 or 1 at this bit position.

(1) First Processing

Figure 8:
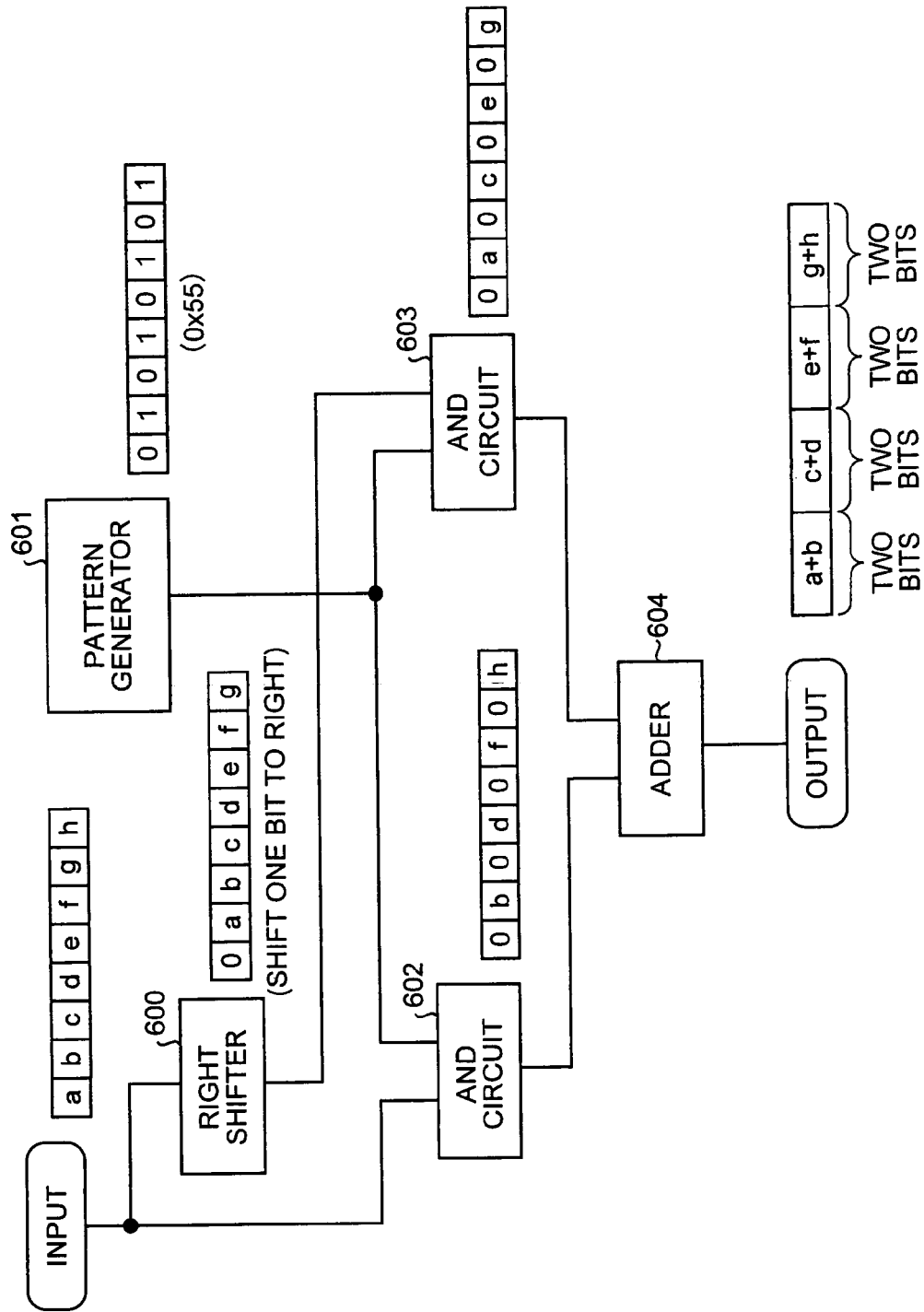
FIG. 8 is an explanatory diagram that shows a detailed example of a first processing shown in the flow in FIG. 7.

Referring to FIG. 8, the right shifter 600 shifts the input data to the right by a predetermined number of bits (i.e., shifts one bit in the first processing) (step S701). Next, the pattern generator 601 generates a predetermined mask pattern ("01010101" that is 0x55) (step S702). The AND circuit 602 takes a logical product of the input data and the mask pattern (step S703), and the other AND circuit 603 takes a logical product of the input data after the right shifting and the mask pattern (step S704). The adder 604 adds these two AND results (step S705).

As a result of the above processing, with respect to the output data from the adder 604, as shown in FIG. 8, the two bits in the highest order are the result of the addition of "a" and "b" in the input data, the next two bits are the result of the addition of "c" and "d", the next two bits are the result of the addition of "e" and "f", and the two bits in the lowest order are the result of the addition of "g" and "h". In other words, these are a result of the sum of an even bit (2n) and an odd bit (2n+1). When the number of repetitions of the processing of steps S701 to S705 does not reach a predetermined number (that is, three when the input data has eight bits) (No at step S706), the process returns to step S701 again.

(2) Second Processing

Figure 9:
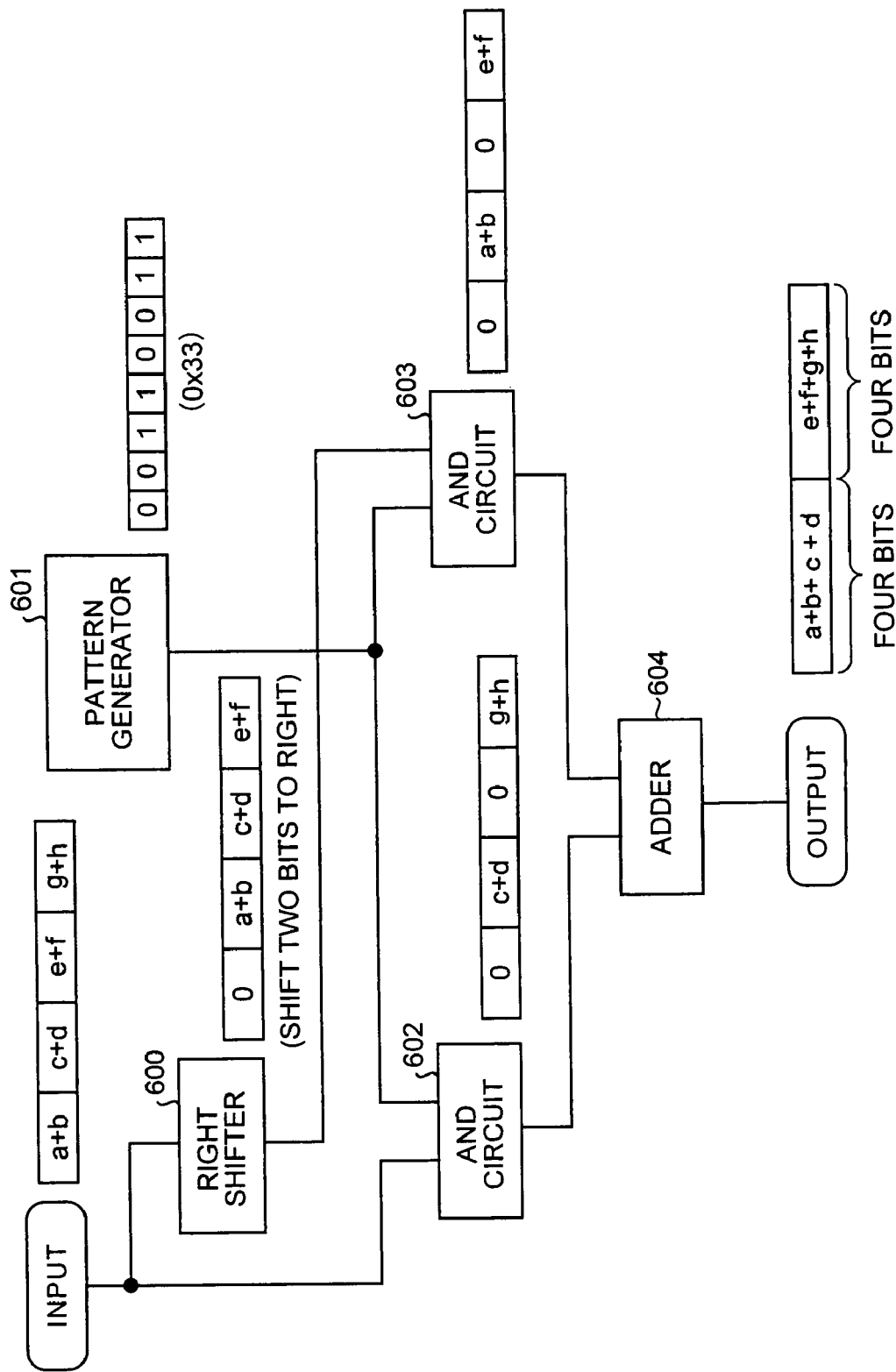
FIG. 9 is an explanatory diagram that shows a detailed example of a second processing shown in the flow in FIG. 7.

Referring to FIG. 9, in the second processing, the output data obtained from the first processing becomes the input data. First, the right shifter 600 shifts the input data to the right by a predetermined number of bits (i.e., shifts two bits in the second processing) (step S701). Next, the pattern generator 601 generates a predetermined mask pattern ("00110011" that is 0x33 in the second processing) (step S702). The AND circuit 602 takes a logical product of the input data and the mask pattern (step S703), and the other AND circuit 603 takes a logical product of the input data after the right shifting and the mask pattern (step S704). The adder 604 adds these two AND results (step S705).

As a result of the above processing, with respect to the output data from the adder 604, as shown in FIG. 9, the four bits in the high order are the result of the addition of "a", "b", "c" and "d" in the input data, and the four bits in the low order are the result of the addition of "e", "f", "g", and "h". As the number of repetitions of the processing of steps S701 to S705 does not reach the predetermined number of three times (No at step S706), the process returns to step S701 again.

(3) Third Processing

Figure 10:
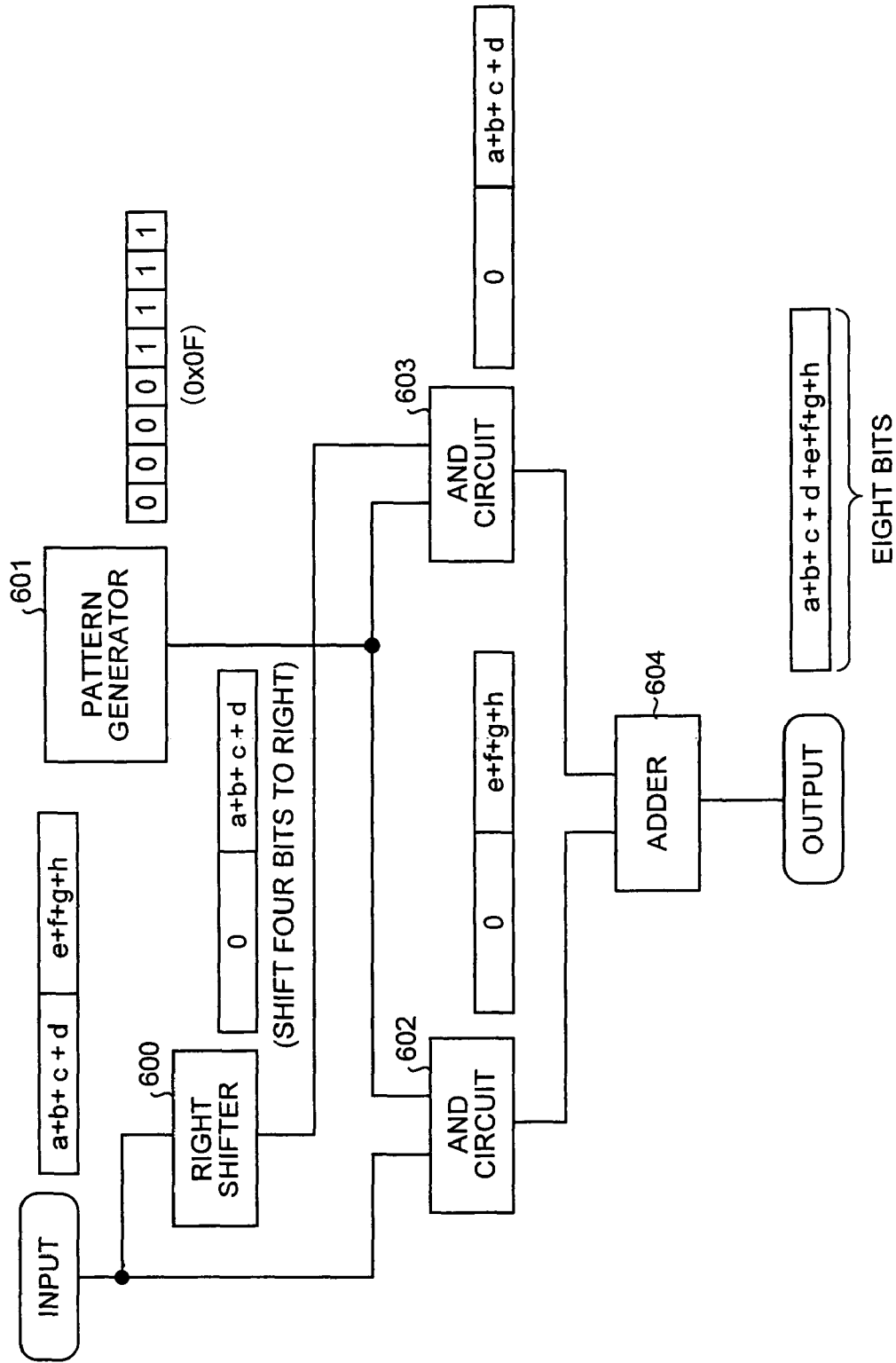
FIG. 10 is an explanatory diagram that shows a detailed example of a third processing shown in the flow in FIG. 7.

Referring to FIG. 10, in the third processing, the output data obtained from the second processing becomes the input data. First, the right shifter 600 shifts the input data to the right by a predetermined number of times (i.e., shifts four bits in the third processing) (step S701). Next, the pattern generator 601 generates a predetermined mask pattern ("00001111 " that is 0x0F) (step S702). The AND circuit 602 takes a logical product of the input data and the mask pattern (step S703), and the other AND circuit 603 takes a logical product of the input data after the right shifting and the mask pattern (step S704). The adder 604 adds these two AND results (step S705).

As a result of the above processing, as shown in FIG. 10, the output data from the adder 604 is a result of the addition of all the bits in the input data, that is, the number of 1s in the input data is stored. The least significant bit of the input data becomes the parity bit of the data. As the number of repetitions of the processing at steps S701 to S705 has reached the predetermined number of three times (Yes at step S706), the processing ends.

The number of repetitions depends on the number of bits of the input data. When the input data has eight bits, there are three repetitions as explained above, and when the input data has 32 bits, there are five repetitions. When the number of bits increases, the number of repetitions increases and the quantity of bits shifted by the right shifter 600 and the mask pattern generated by the pattern generator 601 also change. The processing steps shown in FIG. 7 remain unchanged. FIG. 11 shows bit shift quantities and mask patterns when the input data has eight bits and 32 bits respectively.

When the pattern generator 601 changes generation patterns, it is possible to realize various kinds of processing other than the counting of 1s like in the above example. While the pattern generator 601 generates mask patterns in the above example, the configuration memory 206 may store mask patterns and these mask patterns may be used directly.

A method of assigning parameters will be explained next. Parameters that change at each repetition of processing are only the quantity of bits shifted by the right shifter 600 and the mask pattern generated by the pattern generator 601, as explained above. Therefore, the series of processing may be realized by preparing structure information for each repetition of processing (or by preparing a custom instruction that is different for each repetition of processing) within the configuration memory 206 and by sequentially applying each structure information to the second operating unit 205. However, it is not efficient to occupy the memory with pieces of structure information in which only a part, that is, the parameters, are different.

A more efficient method is as follows. The structure information read each time from the configuration memory 206 is made common (or the memory address assigned in the instruction is kept the same for all instructions). Only the parameters that are different at each time of processing are loaded into a predetermined register as explained below, or fields of these parameters are provided in the instruction, and the parameters are assigned separately. In other words, the parameters for determining the circuit structure of the second operating unit 205 are dispersed to a predetermined register or to the instruction, in addition to the configuration memory 206.

(1) Assignment Based on Special-Purpose Registers

Special-purpose registers for storing parameters of the right shifter 600 and of the pattern generator 601 are assigned. These registers are assigned in the structure information. It is possible to realize the above-described count processing by repeating three times, a three-step processing consisting of a first step of setting the bit quantity to the special-purpose register for the right shifter 600, a second step of setting parameters for generating mask patterns to the special-purpose register for the pattern generator 601, and a third step of executing the custom instruction.

Figure 12:
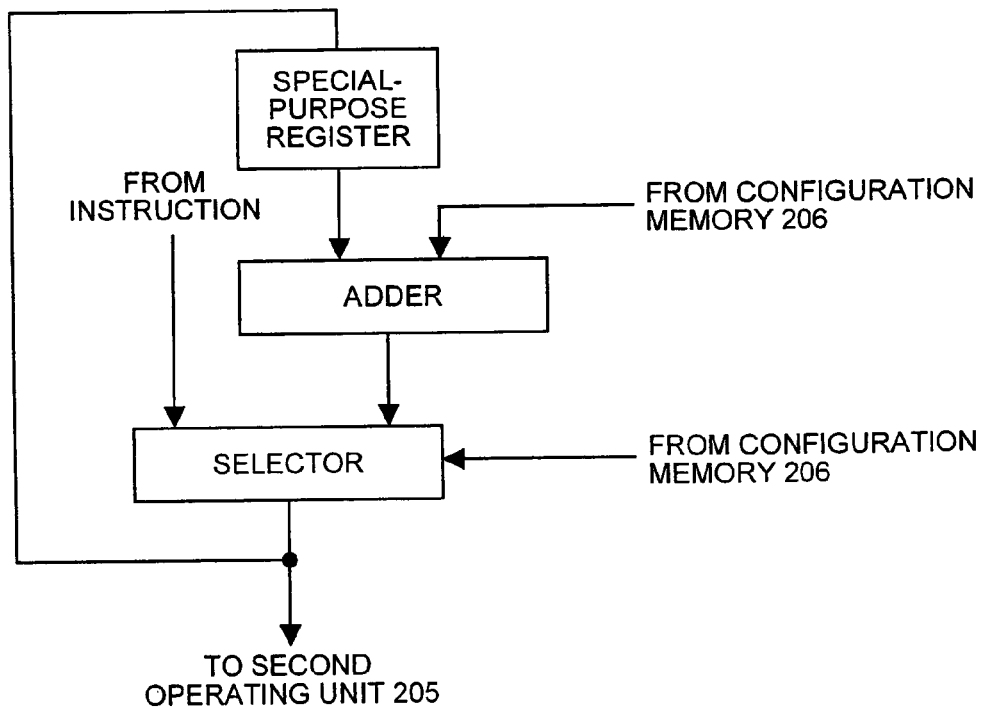
FIG. 12 is an explanatory diagram that shows one example of a circuit structure of a special-purpose register that has an automatic updating function.

(2) Assignment Based on Special-Purpose Registers that have Automatic Updating Function According to the above assigning method (1), the memory that holds the structure information may have a small capacity, but it is necessary to carry out nine steps in total (=three times of three steps). In order to shorten the processing time while saving the memory capacity, in a circuit as shown in FIG. 12, the special-purpose registers for the right shifter 600 and for the pattern generator 601 respectively have an automatic updating function.

In the example shown in the drawing, the sum of the current value within the register and the value within the configuration memory 206 is used as a value after the updating. When the value added to the current value of the register is fixed, such as 1, for example, the configuration memory 206 does not need to supply this value. In the example shown in the drawing, a selector can select either one of this method (2) and a method (3) described later. Which one of the methods is selected is determined based on the structure information within the configuration memory 206.

According to this method (2), the value setting to the special-purpose register is carried out only once at the beginning. As the value is automatically updated in the second processing afterward, the steps required in the above method (1) can be decreased from nine steps to five steps.

(3) Assignment Based on Instruction Code

As another method of assigning parameters, in order to shorten the processing time while saving the memory capacity, the parameters of the right shifter 600 and the pattern generator 601 respectively are directly assigned in the instruction code. With this arrangement, it is not necessary to set the special-purpose registers at each time of processing. Therefore, it is possible to realize the above-described count processing by executing only three times the same custom instruction having parameters different at each time. As the instruction length is usually limited to 32 bits, it is difficult in many cases to secure ten-odd bits to assign the parameters.

(4) Assignment Based on General-Purpose Register

As one input data is handled in the second embodiment, when the instruction format is as shown in FIG. 4, it is possible to assign one more source register. It is also possible to load the parameters to be given to the right shifter 600 and the pattern generator 601, in specific fields of the general-purpose register assigned here.

Figure 13:
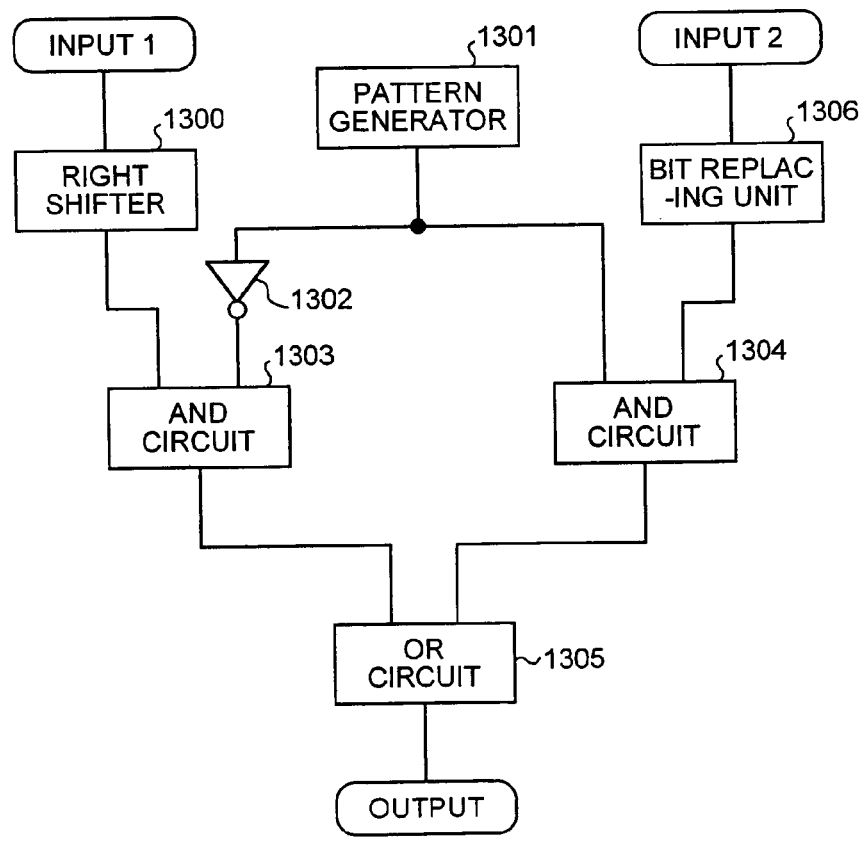
FIG. 13 is an explanatory diagram that schematically shows an internal structure of the second operating unit according to a third embodiment of the present invention.

The initial permutation processing according to the data encryption standard will be explained next. FIG. 13 is an explanatory diagram that schematically shows an internal structure of the second operating unit 205 according to a third embodiment of the present invention. A right shifter 1300, a pattern generator 1301, an inverting circuit 1302, AND circuits 1303 and 1304, an OR circuit 1305, and a bit replacing unit 1306 within the second operating unit 205 are used to carry out the IP processing of 64-bit input data according to the DES, following the process shown in FIG. 14.

According to the DES encryption algorithm, the bit replacement operation is carried out many times. In the IP operation, the bits of 64-bit data as shown in FIG. 15 are replaced as shown in FIG. 16. Each numeral shows a bit position.

The input data before the permutation shown in FIG. 15 is divided into two parts. Bit 1 to bit 32 (1, 2, . . . , 32) are stored in a general-purpose register number 30 (GR30) and bit 33 to bit 64 (33, 34, . . . , 64) are stored in a general-purpose register number 31 (GR31). The output data after the permutation shown in FIG. 16 is also divided into two parts, and the first-half 32 bits (58, 50, . . . , 8) are stored in a general-purpose register number 28 (GR28) and the latter-half 32 bits (57, 49, . . . , 7) are stored in a general-purpose register number 29 (GR29).

Based on the structure information from the configuration memory 206 or based on parameters from the special-purpose register, the second operating unit 205 shown in FIG. 13 is configured in advance such that the right shifter 1300 shifts data to the right by four bits and the pattern generator 1301 outputs a mask pattern 0xF0F0F0F0.

The bit replacing unit 1306 rearranges the bits based on the rules shown in FIGS. 17A and 17B. The symbol "*" shows data at an optional bit position. For example, a value of the most significant bit is uniformly embedded into these positions.

Figure 14:
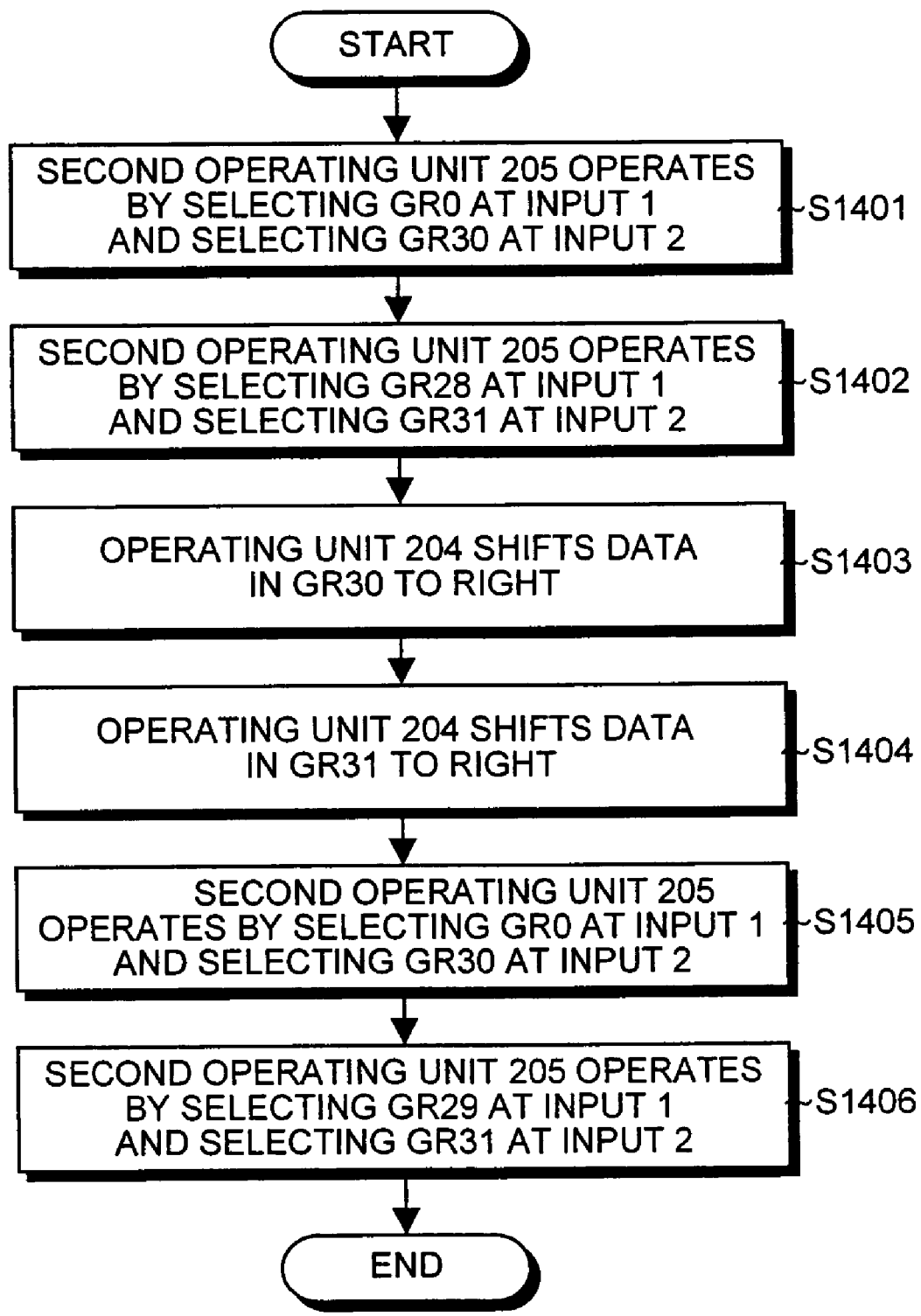
FIG. 14 is a flowchart that shows how a process of initial permutation (IP) of input data is carried out by the second operating unit according to the third embodiment of the present invention.
Figure 18:
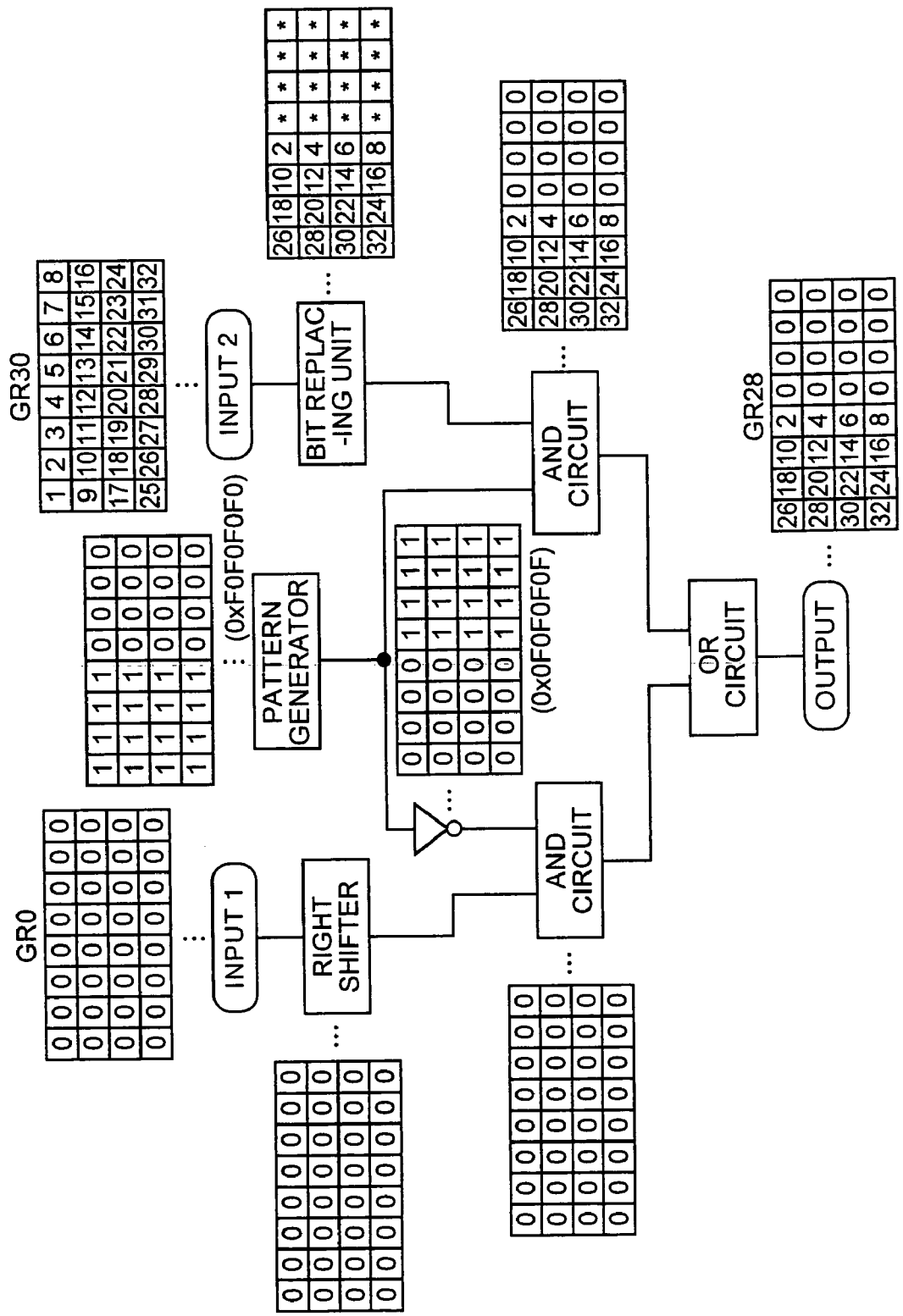
FIG. 18 is an explanatory diagram that shows a detailed example of the processing at step S1401 shown in FIG. 14.

The process shown in FIG. 14 will be explained based on the above assumption. First, as shown in FIG. 18, the second operating unit 205 selects GR0 (i.e., a zero register that is often used in the general processor, and is a special register in which the read values are usually all zero) at the input 1 side, and selects GR30 at the input 2 side. Then, the second operating unit 205 outputs, in the left justification, the 4×4 bits at the upper right corner of the data shown in FIG. 16, to the output register (GR28 is assumed in this case) (step S1401).

Figure 19:
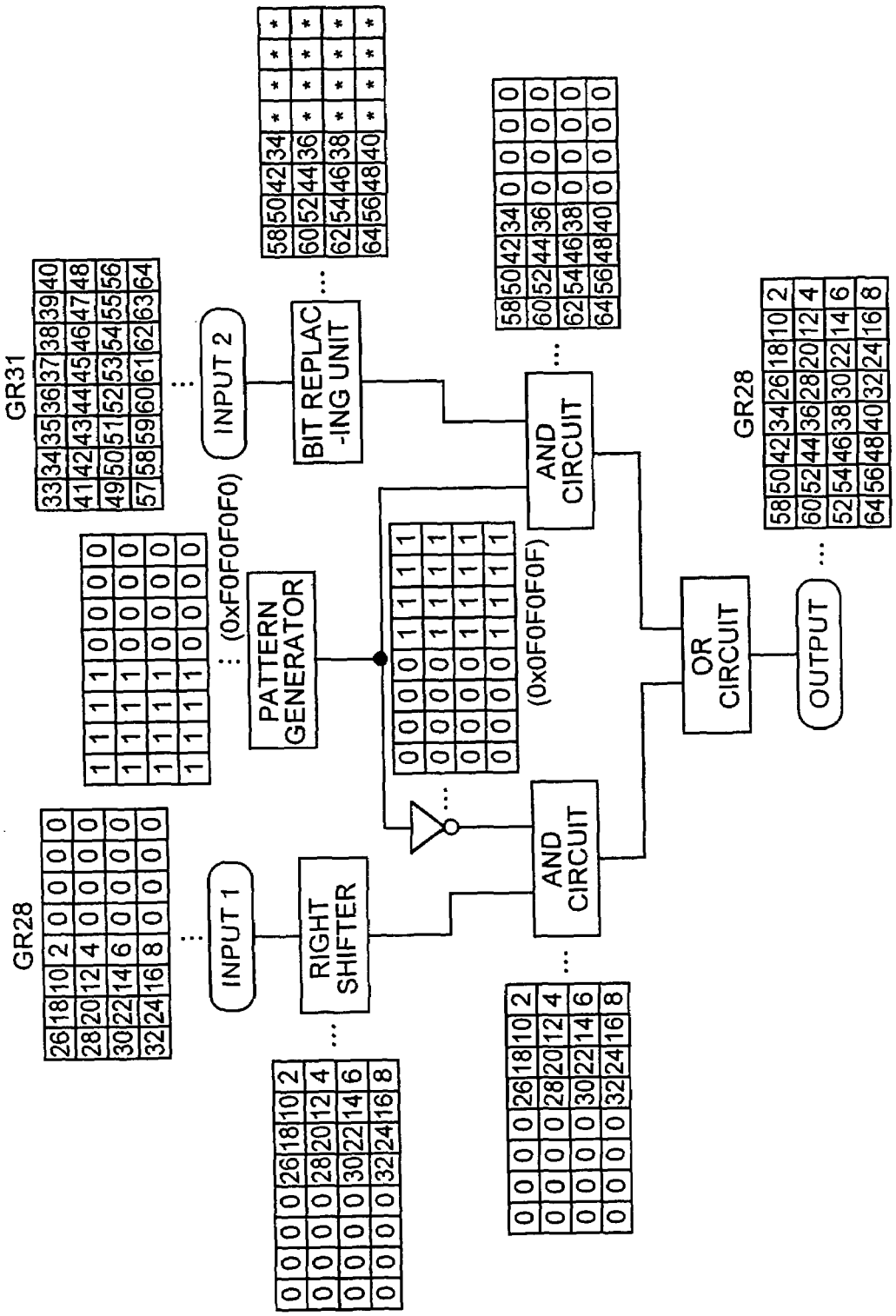
FIG. 19 is an explanatory diagram that shows a detailed example of the processing at step S1402 shown in FIG. 14.

Next, as shown in FIG. 19, the second operating unit 205 selects GR28 after the processing at step S1401, at the input 1 side, and selects GR31 at the input 2 side. Then, the second operating unit 205 outputs the portion of the 8×4 bits at the upper half of the data shown in FIG. 16, to the output register (GR28 is assumed in this case) (step S1402).

Next, the processor gives the right shift instruction to the operating unit 204 as the normal instruction (i.e., the instruction within the instruction set). The operating unit 204 shifts the data in GR30 to the right by one bit, and outputs the result to GR30 (step S1403). Similarly, the processor gives the right shift instruction to the operating unit 204, and the operating unit 204 shifts the data in GR31 to the right by one bit, and outputs the result to GR31 (step S1404).

Figure 20:
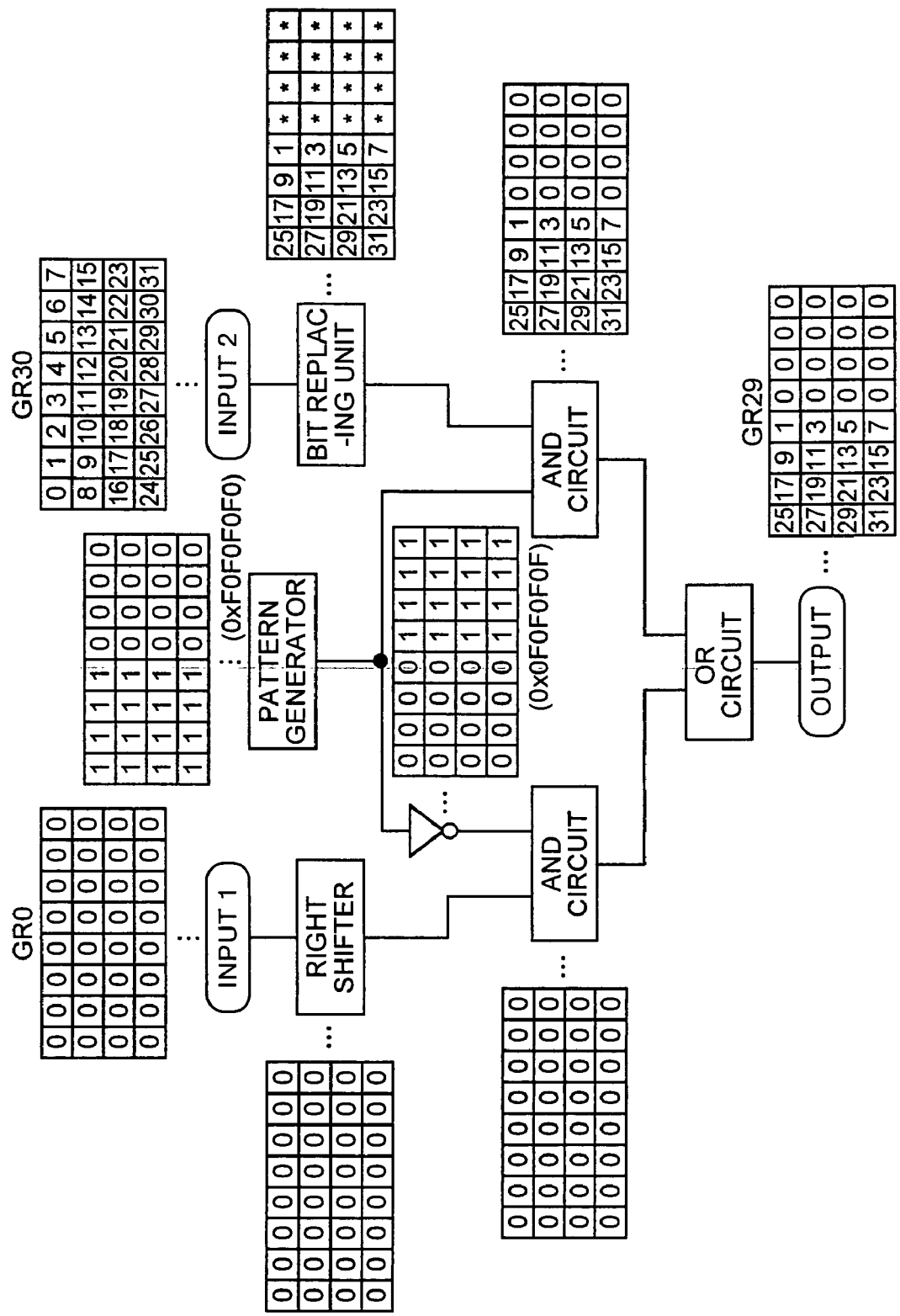
FIG. 20 is an explanatory diagram that shows a detailed example of the processing at step S1405 shown in FIG. 14.

Next, as shown in FIG. 20, the second operating unit 205 selects GR0 at the input 1 side, and selects GR30 after the processing at step S1403, at the input 2 side. Then, the second operating unit 205 outputs, in the left justification, the 4×4 bits at the lower right corner of the data after the permutation shown in FIG. 16, to the output register (GR29 is assumed in this case) (step S1405).

Figure 21:
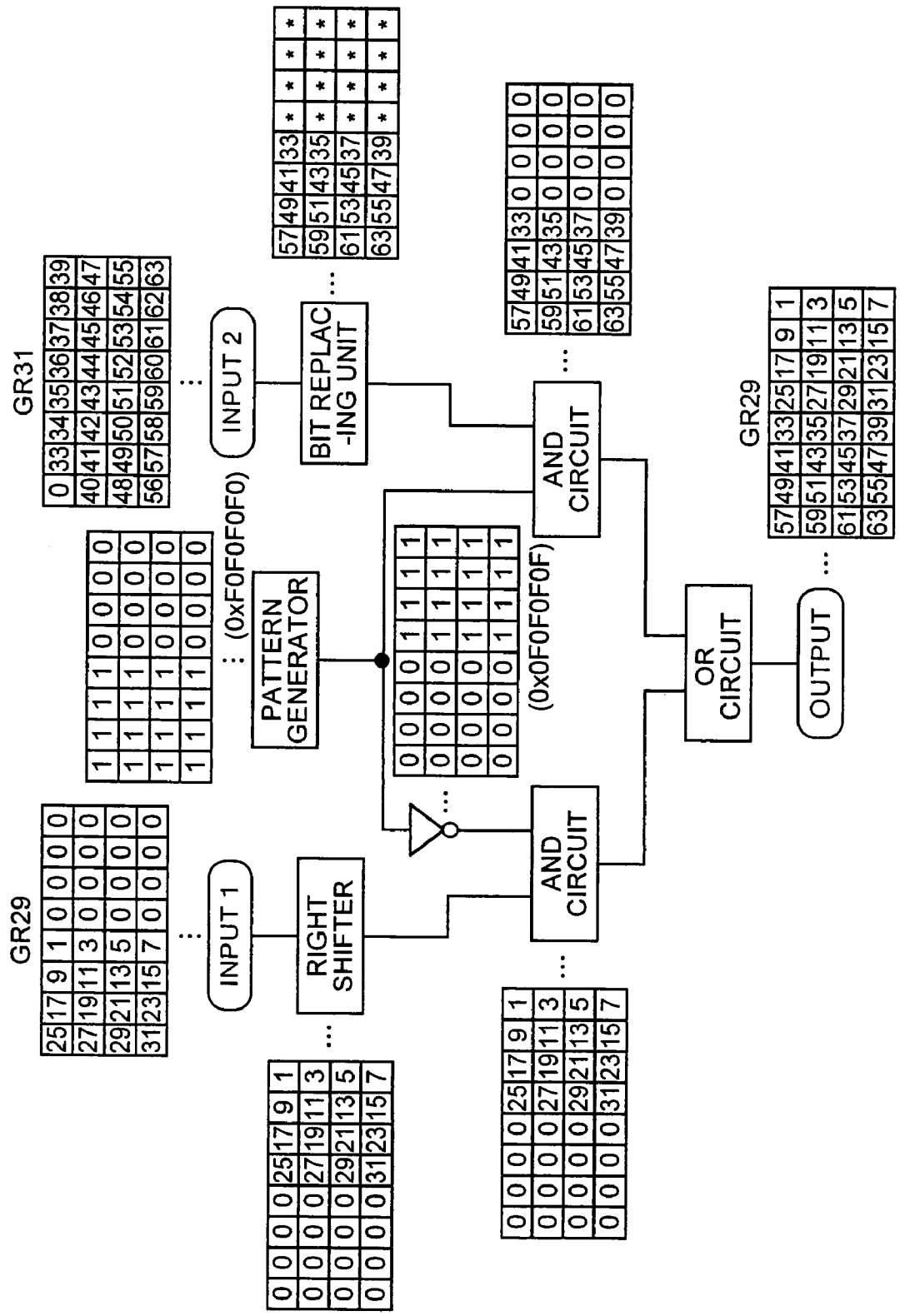
FIG. 21 is an explanatory diagram that shows a detailed example of the processing at step S1406 shown in FIG. 14.

Next, as shown in FIG. 21, the second operating unit 205 selects GR29 after the processing at step S1405, at the input 1 side, and selects GR31 after the processing at step S1404, at the input 2 side. Then, the second operating unit 205 outputs the portion of the 8×4 bits at the lower half of the data shown in FIG. 16, to the output register (GR29 is assumed in this case) (step S1406).

Based on the above operation, the 64-bit input data dividedly stored in GR30 and GR31 is output to GR28 and GR29 after the bit replacement. The IP processing from the state shown in FIG. 15 to the state shown in FIG. 16 ends there. The conventional processor operates on each bit of the data, and, therefore, requires the execution of many instructions to replace all the bits. However, according to the third embodiment, it is possible to realize the IP processing by using six instructions. As a result, it is possible to substantially improve the execution speed.

Using a bit replacing unit that can handle the bit replacement of the entire 64-bit data at once, it is possible to realize this processing by using only one instruction. However, the increase in the circuit scale is unavoidable in this case.

According to the first to the third embodiments, it is possible to define various kinds of custom instructions, by only switching the structure information from the configuration memory 206, without re-preparing individual LSIs or without mounting a large-scale FPGA. Therefore, it is possible to realize very easily and at low cost a custom processor suitable for the user's application.

The second operating unit 205 requires only a few instructions while the conventional operating unit 204 requires a combination of many instructions to realize the same processing. Therefore, it is not only possible to improve the processing speed of the processor itself but also to reduce the size of the program executed by the processor.

The second operating unit 205 in the first to the third embodiments uses the information from the configuration memory 206 only to determine its own internal structure. However, it is also possible to directly handle the configuration memory 206 as a table memory and use the second operating unit 205 only to read optional information within the memory.

In other words, when the information in one entry of the configuration memory 206 has 256 bits, this configuration memory is regarded as a table of one bit×256, two bits×128, or four bits×64. A specific field of a given instruction is regarded as an address of the table, and the data at this address is read or written.

In this case, the second operating unit 205 consists of an operating unit that processes the various kinds of custom instructions described in the first to the third embodiments (or, an operating unit of which internal structure changes based on the structure information from the configuration memory 206), and a selector that extracts optional data from within the configuration memory 206.

Figure 22:
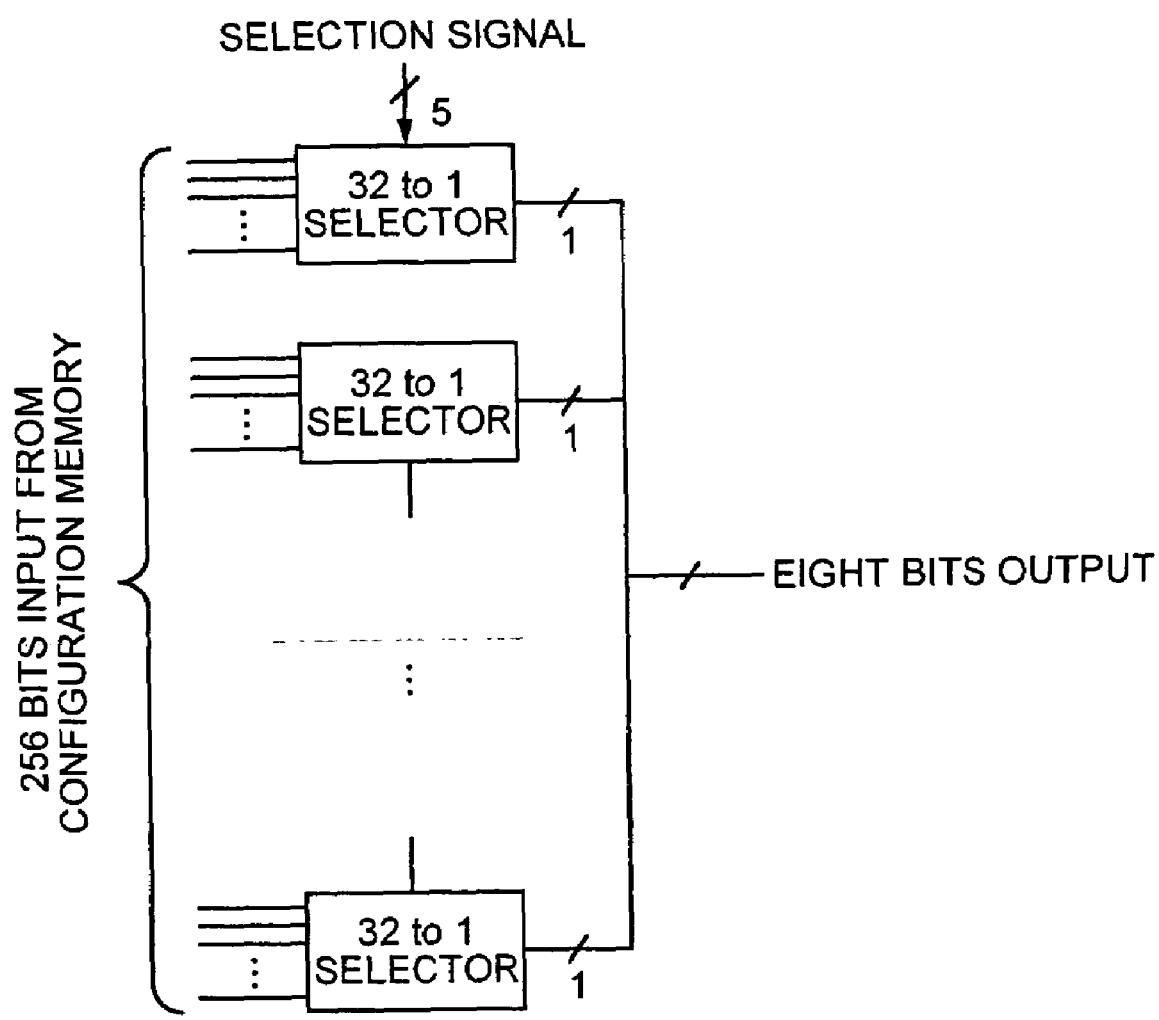
FIG. 22 is an explanatory diagram that shows an example circuit structure of a selector in the configuration memory, when the configuration memory is used as a table memory.

FIG. 22 is an explanatory diagram that shows a circuit structure of this selector. Eight multiplexers of 32 to 1 select (or extract) only eight-bit data from the 256-bit data input from the configuration memory 206. A selection signal (i.e., a five-bit signal that shows which bit is to be selected from among 32 bits) required by each multiplexer is supplied from a general-purpose register, a special-purpose register, or a specific field within the instruction.

Figure 23:
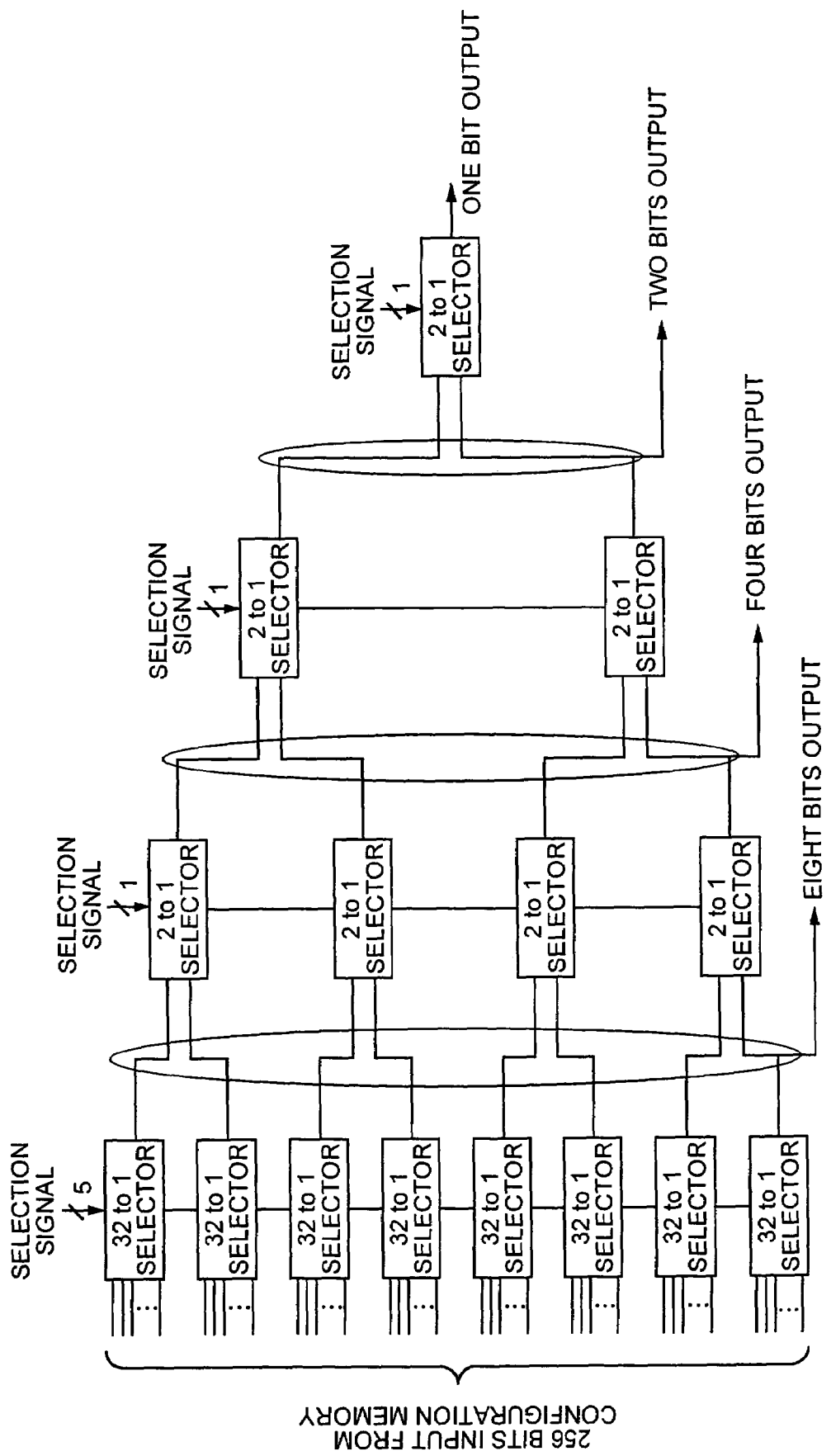
FIG. 23 is an explanatory diagram that shows another example circuit structure of a selector in the configuration memory, when the configuration memory is used as a table memory.

The above shows the example that the configuration memory 206 is used as a table of eight bits×32. When the configuration memory 206 is used as a table of four bits×64, one more bit of selection signal and four more multiplexers of 2 to 1 may further squeeze the eight-bit data output to four bits, as shown in FIG. 23.

When the configuration memory 206 is used as a table of two bits×128, one more bit of selection signal and two more multiplexers of 2 to 1 may further squeeze the four bits to two bits. When still another bit of selection signal and still another multiplexer of 2 to 1 is used, the output finally becomes one bit, and it is possible to use the configuration memory 206 as a table of one bit×256.

Figure 24:
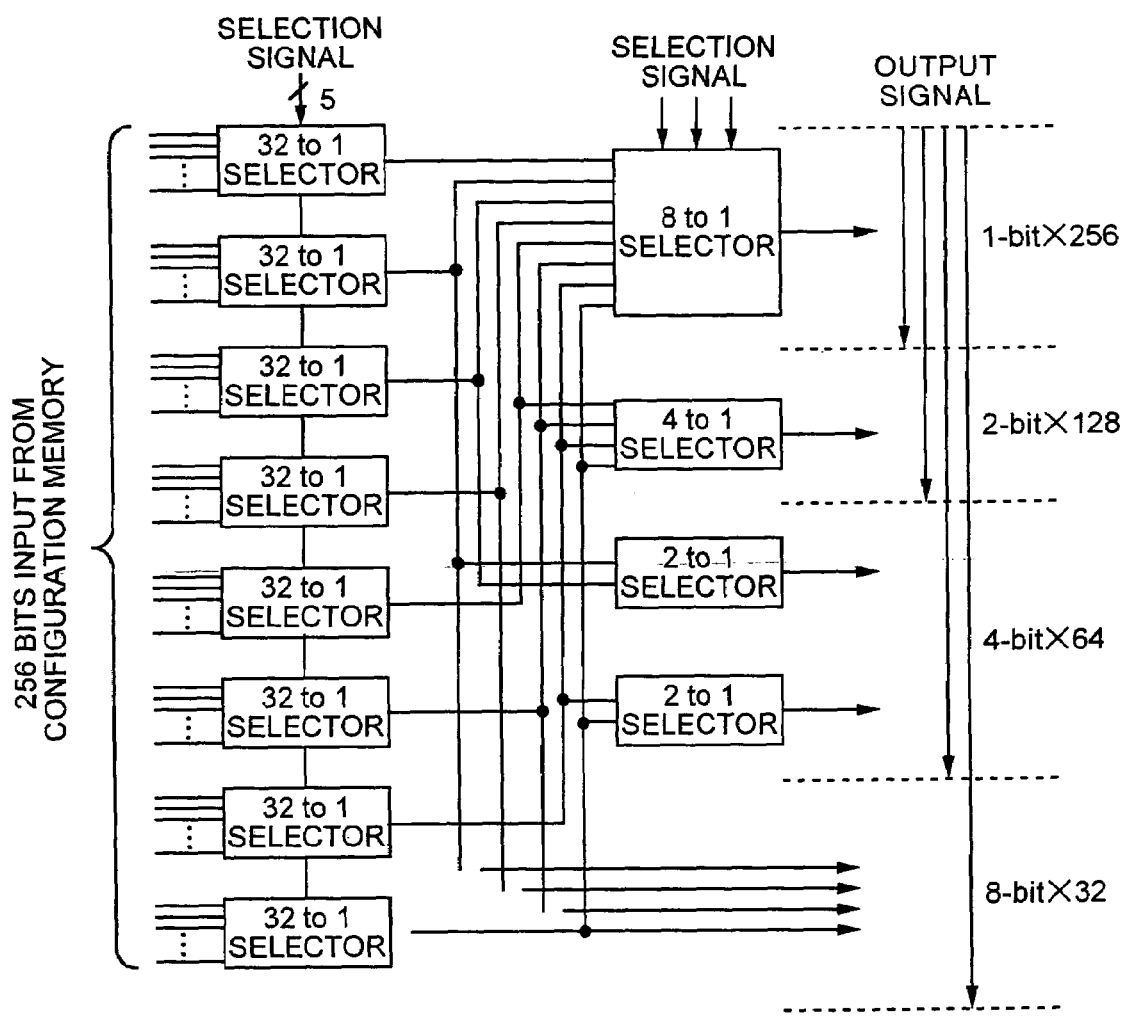
FIG. 24 is an explanatory diagram that shows still another example circuit structure of a selector in the configuration memory, when the configuration memory is used as a table memory.

However, when the selectors are structured as shown in FIG. 24, the width of the output data is limited to the power of 2, and, therefore, the preparation of the table becomes complex. On the other hand, it becomes possible to realize the same function using a smaller circuit than that shown in FIG. 23.

As explained above, the processor realized by the present invention has the following advantages. Even when the given instruction is an instruction that is not prepared within the instruction set (for example, the instruction to interchange bits with the input data, or the instruction to count the number of 1), it is possible to execute this instruction at a high speed by changing the structure of the own operating unit based on the structure information read from the memory. Therefore, there is an effect that is possible to obtain the information processing apparatus that can carry out a high-speed processing of various kinds of instructions defined by a user, without re-preparing individual circuits or without mounting a large-scale circuit.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An information processing apparatus comprising:
   a deciding unit that decides whether a given instruction one of a plurality of predetermined instructions;
   a first operating unit that executes the instruction when the deciding unit decides that the instruction is one of the predetermined instructions;
   a structure information output unit that outputs structure information for determining a circuit structure to execute the instruction when the deciding unit decides that the instruction is not one of the predetermined instructions; and
   at least one second operating unit that includes a plurality of combinational circuits and has the circuit structure determined based on the structure information output from the structure information output unit to execute the instruction, wherein
   the structure information includes a plurality of parameters each of which determines an operation of each of the combinational circuits.

2. The information processing apparatus according to claim 1, wherein the second operating units are provided in plurality.

3. The information processing apparatus according to claim 1, wherein when the deciding unit decides that the instruction is not one of the predetermined instructions, the structure information output unit selectively outputs structure information for determining the circuit structure to execute the instruction, from among pieces of structure information.

4. The information processing apparatus according to claim 3, wherein the structure information output unit selectively outputs structure information for determining the circuit structure to execute the instruction from among the structure information, based on any one of an address assigned by the instruction and an address held in a predetermined register of both.

5. The information processing apparatus according to claim 1, further comprising a rewritable memory that stores the structure information.

6. The information processing apparatus according to claim 5, wherein in addition to the memory, the structure information is stored in a predetermined field within the instruction or in a predetermined register.

7. The information processing apparatus according to claim 6, wherein each time when the second operating unit executes the instruction, a value held in the predetermined register is updated based on the structure information held in the memory.

8. The information processing apparatus according to claim 5, wherein the predetermined instructions include an instruction that instructs to load the structure information into the memory.

9. The information processing apparatus according to claim 5, further comprising:
    a second deciding unit that decides whether the instruction is an instruction to load the structure information into the memory when the deciding unit decides that the instruction is not one of the predetermined instructions; and
    an instruction issuing unit that issues a plurality of instructions to load the structure information into the memory, when the second deciding unit decides that the instruction is the instruction to load the structure information into the memory, wherein
    the first operating unit executes the instruction issued by the instruction issuing unit.

10. The information processing apparatus according to claim 5, further comprising:
    a second deciding unit that decides whether the instruction is an instruction to load the structure information into the memory when the deciding unit decides that the instruction is not one of the predetermined instructions; and
    an instruction issuing unit that issues an instruction to transfer the structure information to a predetermined register to which memory is allocated, when the second deciding unit decides that the instruction is the instruction to load the structure information into the memory, wherein
    the first operating unit executes the instruction issued by the instruction issuing unit.

11. The information processing apparatus according to claim 5, further comprising:
    a second deciding unit that decides whether the instruction is an instruction to load the structure information into the memory when the deciding unit decides that the instruction is not one of the predetermined instructions; and
    an instruction issuing unit that issues an instruction to store the structure information in a predetermined area within an address space to which the memory is allocated, when the second deciding unit decides that the instruction is the instruction to load the structure information into the memory, wherein
    the first operating unit executes the instruction issued by the instruction issuing unit.

12. The information processing apparatus according to claim 5, further comprising:
    a second deciding unit that decides whether the instruction is an instruction to load the structure information into the memory when the deciding unit decides that the instruction is not one of the predetermined instructions; and
    an instructing unit that instructs a DMA controller to transfer the structure information to the predetermined area within the address space to which the memory is allocated, when the second deciding unit decides that the instruction is the instruction to load the structure information into the memory.

13. The information processing apparatus according to claim 1, wherein
    the second operating unit includes a plurality of multiplexers to shuffle a plurality of bits in input data, and
    the structure information includes a plurality of parameters that causes the multiplexers to output bits of mutually different positions in the input data.

14. The information processing apparatus according to claim 1, wherein
    the structure information includes a first parameter and a second parameter, and
    the second operating unit counts the number of 1s within input data, and includes
    a right shifter that shifts the input data to the right by a predetermined number of bits determined by the first parameter;
    a pattern generator that generates a predetermined mask pattern determined by the second parameter;
    a first AND circuit that takes a first logical product of the input data and the predetermined mask pattern;
    a second AND circuit that takes a second logical product of the input data, after being shifted by the right shifter, and the predetermined mask pattern; and
    an adder that adds the first logical product and the second logical product.

15. The information processing apparatus according to claim 1, further comprising a selecting unit that outputs only information at a predetermined bit position within the structure information output from the structure information output unit.

16. The information processing apparatus according to claim 1, wherein the second operating unit performs a bit replacement operation according to the DES encryption algorithm and includes:
    a right shifter that shifts a first input data to the right by a predetermined number of bits;
    a pattern generator that generates a predetermined mask pattern;
    an inverting circuit that inverts the predetermined mask pattern;
    a first AND circuit that takes a first logical product of the first input data, after being shifted by the right shifter, and the predetermined mask pattern inverted by the inverting circuit;
    a bit replacing unit that rearranges a plurality of bits in a second input data;
    a second AND circuit that takes a second logical product of the input data, after rearranged by the bit replacing unit, and the predetermined mask pattern; and
    an OR circuit that takes a logical sum of the first logical product and the second logical product.

17. An information processing method comprising:
    deciding whether a given instruction is one of a plurality of predetermined instructions;
    a first step of executing the instruction when it is decided at the deciding that the instruction is one of the predetermined instructions;
    outputting structure information for determining a circuit structure to execute the instruction when it is decided at the deciding that the instruction is not one of the predetermined instructions; and a second step of executing the instruction by an operating unit including a plurality of combinational circuits and having the circuit structure determined based on the structure information output at the outputting wherein the structure information includes a plurality of parameters each of which determines an operation of each of the combinational circuits.

18. The information processing method according to claim 17, wherein when it is decided at the deciding that the instruction is not one of the predetermined instructions, then at the outputting, structure information is selectively output for determining the circuit structure to execute the instruction, from among pieces of structure information.

19. The information processing method according to claim 18, wherein at the outputting, the structure information is selectively output based on at least one of an address assigned by the instruction and an address held in a predetermined register.

20. The information processing method according to claim 17, wherein the structure information is held in a rewritable memory.

21. The information processing method according to claim 20, wherein the structure information is held in a predetermined field within the instruction or in a predetermined register in addition to the memory.

22. The information processing method according to claim 21, wherein each time when the instruction is executed at the second step, a value held in the predetermined register is updated based on the structure information held in the memory.

23. The information processing method according to claim 20, further comprising:
deciding whether the instruction is an instruction to load the structure information into the memory when it is decided that the instruction is not one of the predetermined instructions; and
issuing a plurality of instructions to load the structure information into the memory when it is decided that the instruction is the instruction to load the structure information into the memory, wherein
the instruction issued at the issuing is executed.

24. The information processing method according to claim 20, further comprising:
deciding whether the instruction is an instruction to load the structure information into the memory when it is decided at the deciding that the instruction is not one of the predetermined instructions; and
issuing an instruction to transfer the structure information to a predetermined register to which the memory is allocated when it is decided that the instruction is the instruction to load the structure information into the memory, wherein
the instruction issued at the issuing is executed.

25. The information processing method according to claim 17, further comprising outputting of only information at a predetermined bit position within the structure information output at the outputting.

26. The information processing method according to claim 17, wherein
the operating unit includes a plurality of multiplexers to shuffle a plurality of bits in an input data, and
the structure information includes a plurality of parameters that causes the multiplexers to output bits of mutually different positions in the input data.

27. The information processing method according to claim 17, wherein
the structure information includes a first parameter and a second parameter; and
the operating unit counts the number of is within an input data, and includes
a right shifter that shifts the input data to the right by a predetermined number of bits determined by the first parameter;
a pattern generator that generates a predetermined mask pattern determined by the second parameter;
a first AND circuit that takes a first logical product of the input data and the predetermined mask pattern;
a second AND circuit that takes a second logical product of the input data, after being shifted by the right shifter, and the predetermined mask pattern; and
an adder that adds the first logical product and the second logical product.

28. The information processing method according to claim 17, wherein the operating unit performs a bit replacement operation according to the DES encryption algorithm, and includes
a right shifter that shifts a first input data to the right by a predetermined number of bits;
a pattern generator that generates a predetermined mask pattern;
an inverting circuit that inverts the predetermined mask pattern;
a first AND circuit that takes a first logical product of the first input data, after being shifted by the right shifter, and the predetermined mask pattern inverted by the inverting circuit;
a bit replacing unit that rearranges a plurality of bits in a second input data;
a second AND circuit that takes a second logical product of the input data, after rearranged by the bit replacing unit, and the predetermined mask pattern; and
an OR circuit that takes a logical sum of the first logical product and the second logical product.

* * * * *

UNITED STATES PATENT AND TRADEMARK OFFICE
CERTIFICATE OF CORRECTION

PATENT NO.       : 7,114,061 B2                                        Page 1 of 1
APPLICATION NO.  : 10/627709
DATED            : September 26, 2006
INVENTOR(S)      : Yoshio Hirose et al.

It is certified that error appears in the above-identified patent and that said Letters Patent is hereby corrected as shown below:

Column 12, Line 38, after "instruction" insert --is--.

Column 15, Line 6, after "outputting" insert --,--.

Column 16, Line 14, change "is" to --1s--.

Signed and Sealed this

Twentieth Day of February, 2007

JON W. DUDAS
*Director of the United States Patent and Trademark Office*